United States Patent
Shimosato

(10) Patent No.: US 9,272,518 B2
(45) Date of Patent: Mar. 1, 2016

(54) MANUFACTURING METHOD OF INKJET HEAD

(75) Inventor: Masashi Shimosato, Shizuoka-ken (JP)

(73) Assignee: Toshiba Tec Kabushiki Kaisha, Tokyo (JP)

( * ) Notice: Subject to any disclaimer, the term of this patent is extended or adjusted under 35 U.S.C. 154(b) by 1040 days.

(21) Appl. No.: 13/323,945

(22) Filed: Dec. 13, 2011

(65) Prior Publication Data

US 2012/0180276 A1     Jul. 19, 2012

(30) Foreign Application Priority Data

Jan. 17, 2011   (JP) .................................. 2011-007125

(51) Int. Cl.
*B41J 2/16*     (2006.01)
*B41J 2/145*    (2006.01)
*H04R 17/00*    (2006.01)
*B41J 2/045*    (2006.01)
(Continued)

(52) U.S. Cl.
CPC .............. *B41J 2/161* (2013.01); *B41J 2/1607* (2013.01); *B41J 2/1612* (2013.01); *B41J 2/1643* (2013.01); *H04R 17/00* (2013.01); *B41J 2/04541* (2013.01); *B41J 2/14* (2013.01); *B41J 2/14072* (2013.01); *B41J 2/14201* (2013.01); *B41J 2/14209* (2013.01); *B41J 2002/14491* (2013.01); *H05K 3/4644* (2013.01); *H05K 3/4658* (2013.01); *Y10T 29/42* (2015.01); *Y10T 29/49128* (2015.01); *Y10T 29/49147* (2015.01); *Y10T 29/49155* (2015.01); *Y10T 29/49401* (2015.01)

(58) Field of Classification Search
CPC ........ B41J 2/161; B41J 2/1612; B41J 2/1607; B41J 2/1643; B41J 2/04541; B41J 2/14201; B41J 2/14; B41J 2/14072; B41J 2/14209; B41J 2002/14491; H04R 17/00; H05K 3/4644; H05K 3/4658; Y10T 29/42; Y10T 29/49401; Y10T 29/49128; Y10T 29/49147; Y10T 29/49155
USPC ..................... 29/890.1, 25.35, 831, 842, 846; 205/125, 127; 347/63, 68, 70, 71
See application file for complete search history.

(56) References Cited

U.S. PATENT DOCUMENTS

| 5,880,018 A | 3/1999 | Boeck et al. | |
|---|---|---|---|
| 2004/0233255 A1* | 11/2004 | Parish et al. | 347/63 |
| 2006/0055741 A1* | 3/2006 | Watanabe et al. | 347/68 |

(Continued)

FOREIGN PATENT DOCUMENTS

| JP | 05155029 A * | 6/1993 | ............ 29/890.1 |
|---|---|---|---|
| JP | 2002-144566 | 5/2002 | |

(Continued)

OTHER PUBLICATIONS

Machine Language Translation (English) of Japanese Patent Publication, JP 2002-144566, Nov. 2014.*

(Continued)

*Primary Examiner* — A. Dexter Tugbang
(74) *Attorney, Agent, or Firm* — Amin Turocy & Watson, LLP

(57) ABSTRACT

A manufacturing method of an inkjet head including, forming an insulating layer which is compact compared to a piezoelectric member with respect to a region other than a driving unit which ejects ink, in the piezoelectric member, and forming an electrode for applying a driving voltage to the driving unit, by performing electroless plating with respect to the driving unit and the insulating layer.

14 Claims, 11 Drawing Sheets

(51) Int. Cl.
*B41J 2/14* (2006.01)
*H05K 3/46* (2006.01)

(56) References Cited

U.S. PATENT DOCUMENTS

2008/0029294 A1* 2/2008 Kawamura et al. ......... 29/846 X
2010/0097431 A1    4/2010 Takakuwa
2010/0314971 A1* 12/2010 Kaida et al. ............. Y10T 29/42

FOREIGN PATENT DOCUMENTS

| JP | 2002-172789 | 6/2002 |
| JP | 2003-341073 | 12/2003 |
| JP | 2005-260260 | 9/2005 |
| JP | 2007-331135 | 12/2007 |
| JP | 2010-118641 | 5/2010 |
| WO | 2007-086368 A1 | 8/2007 |

OTHER PUBLICATIONS

Office Action of Notification of Reason(s) for Refusal for Japanese Patent Application No. 2011-007125 Dated Nov. 12, 2013, 2 pgs.
Office Action of Notification of Reason(s) for Refusal for Japanese Patent Application No. 2011-007125 Dated Oct. 7, 2014, 2 pages.

* cited by examiner

MANUFACTURING METHOD OF INKJET HEAD

CROSS-REFERENCE TO RELATED APPLICATION(S)

This application is based upon and claims the benefit of priority from Japanese Patent Application No. 2011-007125, filed on Jan. 17, 2011; the entire contents of which are incorporated herein by reference.

FIELD

Embodiments described herein generally relate to a manufacturing method of an inkjet head which has an electrode formed by electroless plating.

BACKGROUND

In an inkjet head, ink is ejected by deforming a piezoelectric member. In the piezoelectric member, an electrode is formed in order to apply a voltage to the piezoelectric member. The electrode is formed by electroless plating. The electroless plating means that metal is precipitated due to a chemical reaction using a solution (electroless plating solution) in which metal ions to be plated are dissolved.

There is a first method of forming electrodes in which a portion in which electrodes are not formed is masked in the piezoelectric member, and a preprocessing of the electroless plating (for example, etching) is performed. After separating the mask, it is possible to form electrodes by precipitating the metal ion to be plated using the electroless plating in the preprocessed part.

There is a second method of forming electrodes in which the plating is formed using the electroless plating with respect to the entire surface of the piezoelectric member. It is possible to form the electrodes by removing the plating on the other portion by etching, in a state where a portion in which the electrodes are formed is masked.

Since the piezoelectric member is a sintered body which is formed of fine particles, in the first method, there is a concern that the plating may be precipitated at a portion where the electrodes are not formed, since the solution from the preprocessing is permeated between the mask and the piezoelectric member. In addition, in the second method, there is a concern that the precipitated plating remains between the particles, even if the etching is performed. In addition, there is a concern that permeation of the plating may occur.

DETAILED DESCRIPTION

In the manufacturing method of an inkjet head which is an embodiment, an insulating layer which is more compact compared to a piezoelectric member is formed in the piezoelectric member with respect to a region other than a driving unit in which ink is ejected, and electrodes for applying a driving voltage to the driving unit are formed, by performing the electroless plating with respect to the driving unit and the insulating layer.

First Embodiment

An inkjet head according to a first embodiment will be described.

Figure 1:
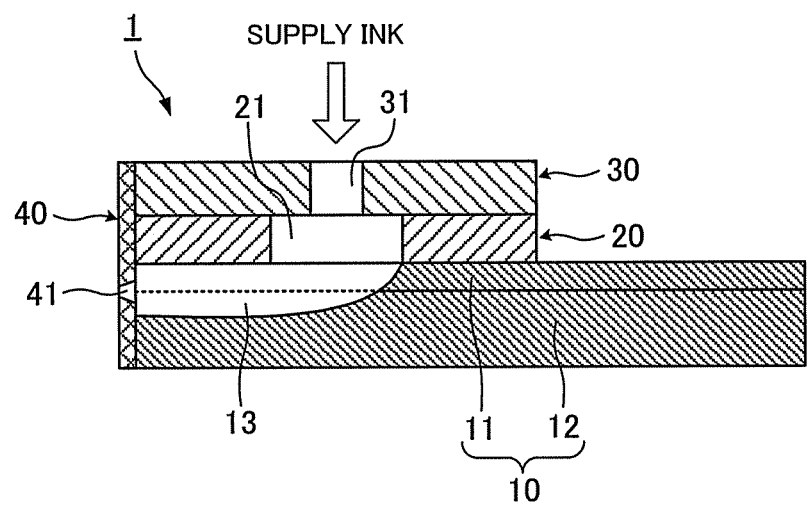
FIG. 1 is a cross-sectional view of an inkjet head according to a first embodiment.
Figure 2:
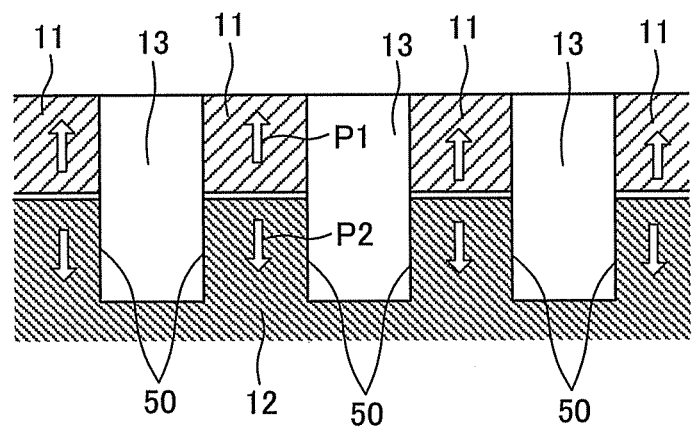
FIG. 2 is a cross-sectional view of the inkjet head according to the first embodiment.

The structure of an inkjet head 1 will be described with reference to FIGS. 1 and 2. FIG. 1 is a cross-sectional view of the inkjet head. FIG. 2 is a cross-sectional view of the inkjet head in a surface which is orthogonal to a sheet surface of FIG. 1.

The inkjet head 1 includes a substrate 10. The substrate 10 is configured by laminating two piezoelectric members 11 and 12. As the piezoelectric members 11 and 12, for example, it is possible to use lead zirconate titanate (PZT).

The two piezoelectric members 11 and 12 are subject to polarization processing. As shown in FIG. 2, the polarization directions P1 and P2 of the two piezoelectric members 11 and 12 are different from each other. The direction of arrow P1 is the polarization direction of the piezoelectric members 11, and the direction of arrow P2 is the polarization direction of the piezoelectric members 12. The piezoelectric members 11 and 12 which constitute a pressure chamber 13 are covered with electrodes 50.

The substrate 10 has pressure chambers 13. As shown in FIG. 2, a plurality of pressure chambers 13 is aligned in one direction. The pressure chamber 13 is configured by the piezoelectric members 11 and 12, and the piezoelectric members 11 and 12 which constitute the pressure chamber 13 correspond to a driving unit.

Electrodes are formed on the inner wall surface of the pressure chamber 13. The electrodes are used to apply a voltage to the piezoelectric members 11 and 12 which constitute the pressure chamber 13. The electrodes which are formed on the inner wall surface of the pressure chamber 13 are connected to a driving circuit through electrodes which are formed on the surface of the substrate 10. The driving circuit applies the voltage with respect to the piezoelectric members 11 and 12 using a predetermined driving pattern.

A frame member 20 is provided on the surface of the substrate 10, and clogs a part of the pressure chamber 13. The frame member 20 has an opening portion 21, and the opening portion 21 is connected to the pressure chamber 13.

A lid member 30 is fixed to the frame member 20. The lid member 30 has an opening portion 31, and the opening portion 31 is connected to the opening portion 21 of the frame member 20. The opening portions 21 and 31 are passages for guiding ink to the pressure chamber 13. The opening portion 31 is connected to an ink tank through a tube.

A nozzle plate 40 is fixed to an end surface of the substrate 10, and clogs the pressure chamber 13. The nozzle plate 40 is also fixed to the frame member 20 and the lid member 30. The nozzle plate 40 has a nozzle 41, and the nozzle 41 is connected to the pressure chamber 13. The nozzle 41 is provided corresponding to each of the pressure chambers 13.

Subsequently, an operation of the inkjet head 1 will be described with reference to FIGS. 3 and 4. When a voltage is applied to the piezoelectric members 11 and 12 which constitute the pressure chamber 13 from the electrodes 50, as shown in FIGS. 3 and 4, it is possible to deform the piezoelectric members 11 and 12.

Figure 3:
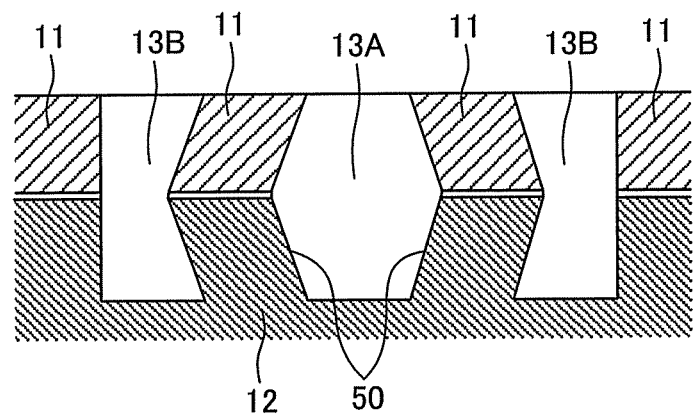
FIG. 3 is an explanatory diagram which describes an operation of the inkjet head according to the first embodiment.

In a state shown in FIG. 3, a capacity of a pressure chamber 13A increases by deformation of the piezoelectric members 11 and 12. It is possible to take in the ink in the pressure chamber 13A, by increasing the capacity of the pressure chamber 13A. That is, the ink moves to the pressure chamber 13A passing through the opening portions 31 and 21. In a pressure chamber 13B neighboring the pressure chamber 13A, a capacity thereof is reduced due to the deformation of the piezoelectric members 11 and 12.

Figure 4:
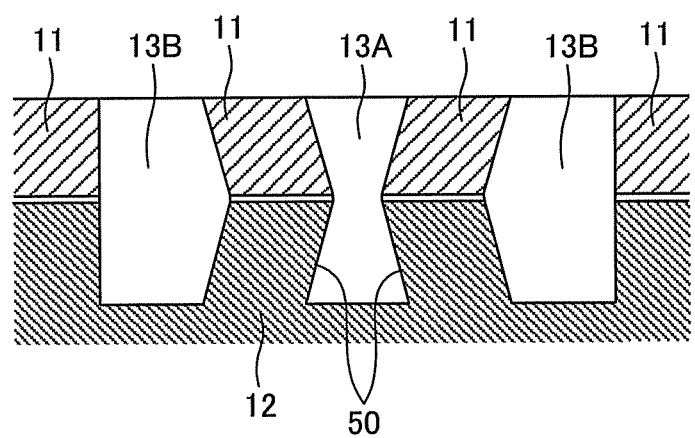
FIG. 4 is an explanatory diagram which describes the operation of the inkjet head according to the first embodiment.

In a state shown in FIG. 4, the capacity of the pressure chamber 13A is reduced due to the deformation of the piezoelectric members 11 and 12. By reducing the capacity of the pressure chamber 13A, it is possible to allow pressure in the pressure chamber 13A to rise and the ink to eject, which is taken in the pressure chamber 13A. The ink in the pressure chamber 13A is ejected to the outside of the inkjet head 1 passing through the nozzle 41. In the pressure chamber 13B neighboring the pressure chamber 13A, the capacity thereof increases due to the deformation of the piezoelectric members 11 and 12.

Subsequently, the manufacturing method of the inkjet head 1 will be described with reference to FIGS. 5 to 9.

Figure 5:
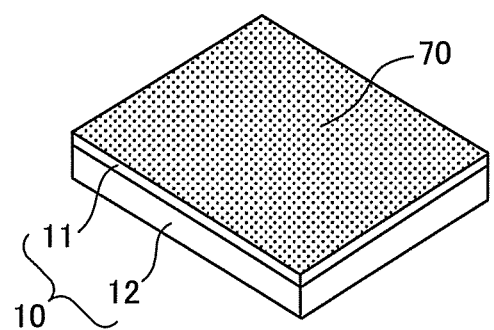
FIG. 5 is a diagram which shows a manufacturing process of the inkjet head according to the first embodiment.

First, as shown in FIG. 5, the substrate 10 is formed, by laminating the piezoelectric members 11 and 12 which are tabular shapes. As described using FIG. 2, the piezoelectric members 11 and 12 are polarized in the directions of arrows P1 and P2. A glass coating layer 70 is formed on the front surface of the substrate 10. The glass coating layer 70 is formed on the front surface of the piezoelectric member 11, and is formed on the entire front surface of the substrate 10, according to the embodiment. As a glass coating agent which forms the glass coating layer 70, for example, it is possible to use Siragusital which is made by Bokuto Kasei Kogyo KK.

It is possible to form the glass coating layer 70 on the substrate 10 using a well-known method. In detail, it is possible to form the glass coating layer 70 using a dry coating method or a wet coating method. If a temperature is too high when forming the glass coating layer 70, then there is a concern that the substrate 10 (piezoelectric members 11 and 12) may deteriorate, therefore it is preferable to form the glass coating layer 70 taking this fact into consideration. For example, as a temperature when forming the glass coating layer 70, it is possible to set the temperature to a half or less of the Curie temperature of the substrate 10 (piezoelectric members 11 and 12).

Figure 6:
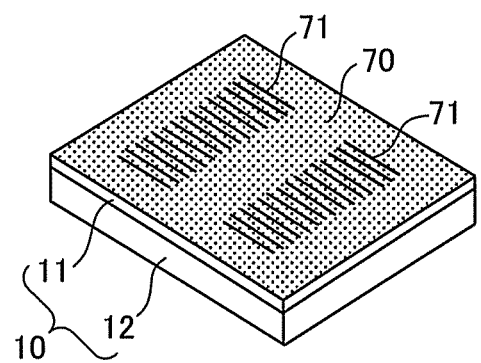
FIG. 6 is a diagram which shows the manufacturing process of the inkjet head according to the first embodiment.

Subsequently, as shown in FIG. 6, a plurality of grooves 71 is formed on the substrate 10 on which the glass coating layer 70 is formed. The groove 71 corresponds to the pressure chamber 13. It is possible to form the groove 71, for example, using a diamond-cutter. The forming position or the number of the grooves 71 is appropriately set in consideration of the structure or the like of the inkjet head 1. In the embodiment, the plurality of grooves 71 is formed by aligning in one direction, and two rows of the plural grooves 71 are provided.

Subsequently, a resist is applied to the entire front surface of the glass coating layer 70, and exposing and developing are performed so that the resist remains only in regions where the electrodes are not formed. In addition, a plating nucleus is formed with respect to regions where the electrodes are formed, by performing a preprocessing of the plating. When separating the resist, the plating nucleus remains only in the region where the electrodes are formed.

In the embodiment, the resist is applied after forming the groove 71; however, it is possible to apply the resist before forming the groove 71. In detail, the exposing and developing are performed so that the resist remains only in the region where the electrodes are not formed after applying the resist in the entire front surface of the glass coating layer 70. In addition, it is possible to form the groove 71 at a predetermined position of the region where the electrodes are formed.

When a liquid resist is used, it is preferable to form the groove 71 after applying the resist. When the liquid resist is applied after forming the groove 71, the liquid resist fills up the groove 71, and it is difficult to remove the resist. When applying the resist after forming the groove 71, it is preferable to use a dry film resist or an electrodeposition resist. It is possible to prevent the resist from filling up the groove 71, by using the dry film resist or the electrodeposition resist.

Figure 7:
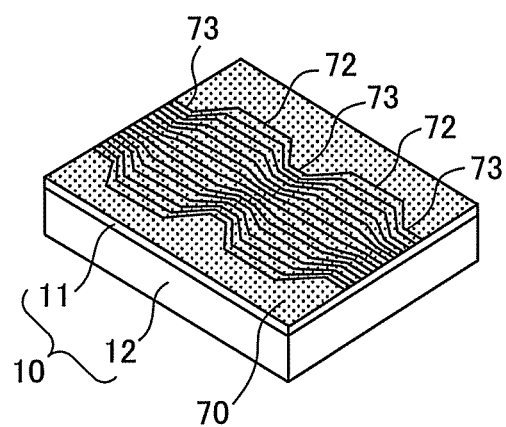
FIG. 7 is a diagram which shows the manufacturing process of the inkjet head according to the first embodiment.

Subsequently, electrodes 72 and 73 are formed in the region where the plating nucleus is present, by performing electroless Ni plating (refer to FIG. 7). The electrode 72 is formed in the groove 71, and comes into contact with the piezoelectric members 11 and 12. The electrode 72 corresponds to the electrode 50 which is described in FIG. 3. The electrode 73 is formed in a predetermined region other than the groove 71, and is formed on the front surface of the glass coating layer 70. That is, the glass coating layer 70 is present between the electrode 73 and the piezoelectric member 11.

Subsequently, gold plating is formed on the nickel electrodes 72 and 73, using electroplating. By forming the gold plating, it is possible to reduce resistance values of the electrodes 72 and 73, and to reduce deviation of the electrodes 72 and 73. In addition, it is possible to use the gold plating in order to suppress a formation of an oxide film. When parts of a plurality of electrodes 72 and 73 are connected to each other, it is possible to easily perform the electroplating. The parts at which the plurality of electrodes, 72 and 73 are connected to each other may be removed, after performing the electroplating.

Figure 8:
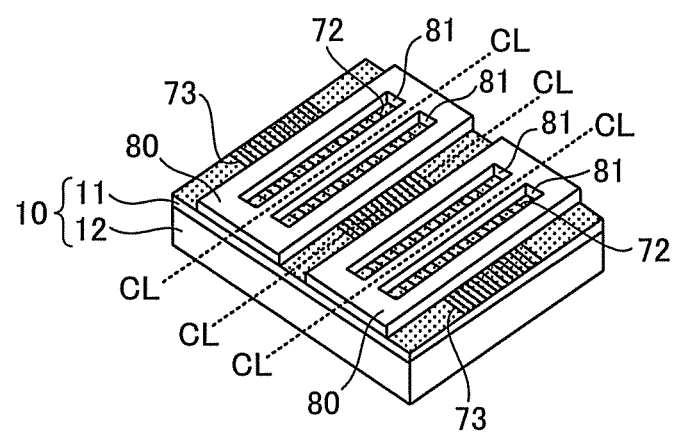
FIG. 8 is a diagram which shows the manufacturing process of the inkjet head according to the first embodiment.

Subsequently, as shown in FIG. 8, two frame members 80 are disposed at the upper surface of the electrodes 72 and 73. Each frame member 80 is arranged along a row of the groove 71 (electrode 72). The frame member 80 has two opening portions 81, and there is a row of the groove 71 (electrode 72) in the inner side of each of the opening portions 81. The frame member 80 corresponds to the frame member 20 described in FIG. 1, and the opening portion 81 corresponds to the opening portion 21 of the frame member 20.

Figure 9:
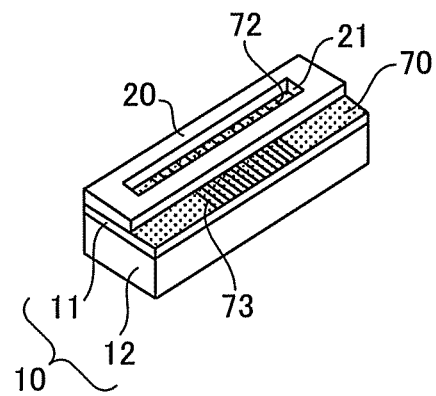
FIG. 9 is a diagram which shows the manufacturing process of the inkjet head according to the first embodiment.

When cutting the member shown in FIG. 8 along three cutting lines CL, it is possible to obtain a structure body shown in FIG. 9. In FIG. 9, if the lid member 30 is fixed to the frame member 20, then the inkjet head 1 described in FIG. 1 is obtained. As shown in FIG. 9, if ink is supplied to the opening portion 21 of the frame member 20, then it is possible to supply ink to the plurality of grooves 71 (pressure chamber 13) which is positioned inside the opening portion 21.

According to the manufacturing method of the embodiment, it is possible to prevent a preprocessing solution of the electroless plating from permeating between the particles of the piezoelectric member 11, by covering the front surface of the piezoelectric member 11 with the glass coating layer 70, before performing the electroless plating. It is possible to form the electrodes 72 and 73 only in a predetermined region, when the preprocessing solution is prevented from permeating between the particles of the piezoelectric member 11. Since the glass coating layer 70 is a compact substance compared to the piezoelectric member 11, the bleeding out of the plating, can be prevented.

According to the embodiment, a glass coating agent is used as the material of the glass coating layer 70; however, it is possible to use another material. As the material of the glass coating layer 70, for example, it is possible to use an organic material such as polyimide (PI). The material of the glass coating layer 70 may have insulation properties, and may perform the electroless plating. In addition, the glass coating layer 70 may be the compact substance compared to the substrate 10 (piezoelectric members 11 and 12).

When considering the manufacturing process of the inkjet head 1, it is preferable that the glass coating layer 70 can endure processing other than the electroless plating (for example, etching). In addition, when the inkjet head 1 is used, it is preferable that the glass coating layer 70 can endure the ink, since it comes into contact with the ink.

In the embodiment, the glass coating layer 70 is formed on the entire front surface of the substrate 10; however, it is possible to form the glass coating layer 70 in only a part of region of the substrate 10. In detail, it is possible to form the glass coating layer 70 at least in a region where the electrode 72 is formed.

The method of forming the electrodes 72 and 73 is not limited to the method which is described in the embodiment. The electrode 72 may be formed on the surface of the groove 71, and the electrode 73 may be formed on the front surface of the glass coating layer 70. For example, in a state shown in FIG. 6, the electroless plating is performed in the entire surface of the glass coating layer 70. Subsequently, a mask is formed in the region where the electrodes 72 and 73 are formed, and the plating in a region where the electrodes 72 and 73 are not formed can be removed using the etching.

Second Embodiment

An inkjet head according to a second embodiment will be described.

Figure 10:
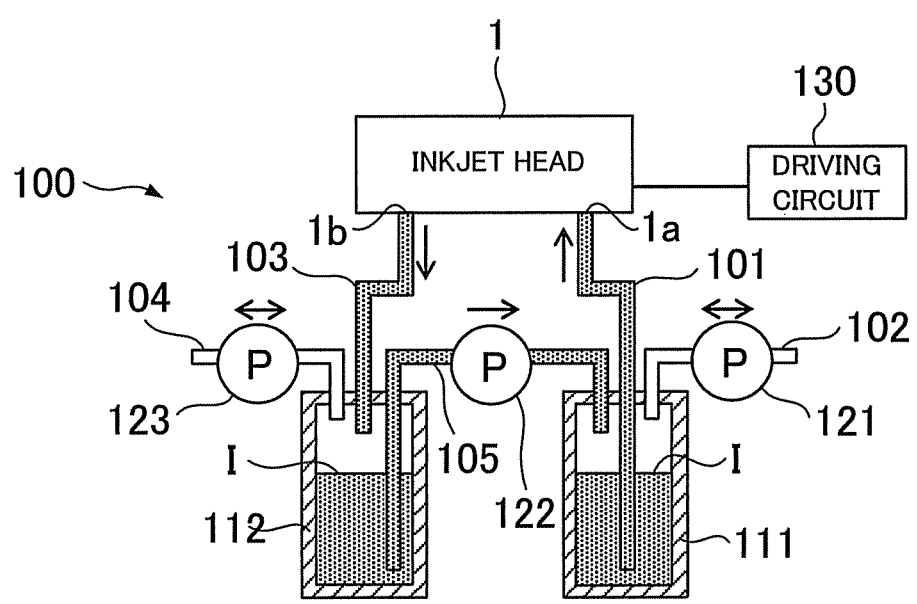
FIG. 10 is a schematic diagram of an ink supply unit.

An ink supply unit 100 which supplies ink to an inkjet head 1 according to the embodiment will be described with reference to FIG. 10.

A first ink tank 111 is connected to an ink supply port 1a of the inkjet head 1 through a tube 101. Ink I is received in the first ink tank 111, and the ink I in the first ink tank 111 is supplied to the ink supply port 1a through the tube 101, by an operation (pressure adjustment) of a first pump 121.

The first pump 121 is connected to the first ink tank 111 through a tube 102. Air pressure in the first ink tank 111 is adjusted using the first pump 121, and is maintained to a higher state than atmospheric pressure. It is possible to supply the ink I in the first ink tank 111 to the inkjet head 1 through the tube 101. An arrow which is attached to the first pump 121 denotes the movement direction of air due to an operation of the first pump 121.

A second ink tank 112 is connected to an ink outlet 1b of the inkjet head 1 through a tube 103, and the ink discharged from the ink outlet 1b is received in the second ink tank 112. The ink I in the second ink tank 112 passes through a tube 105, and is guided to the first ink tank 111, due to an operation of a conveying pump 122. The ink I circulates passages of the first ink tank 111, inkjet head 1, and the second ink tank 112. An arrow which is attached to the conveying pump 122 shows the movement direction of the ink I along with the operation of the conveying pump 122.

A second pump 123 is connected to the second ink tank 112 through a tube 104. The second pump 123 is adjusted so that air pressure in the second ink tank 112 is maintained at a state which is lower than atmospheric pressure. An arrow which is attached to the second pump 123 shows the movement direction of air due to an operation (pressure adjustment) of the second pump 123.

A driving circuit 130 sends a driving signal to the inkjet head 1. The inkjet head 1 ejects ink when receiving the driving signal from the driving circuit 130.

Figure 11:
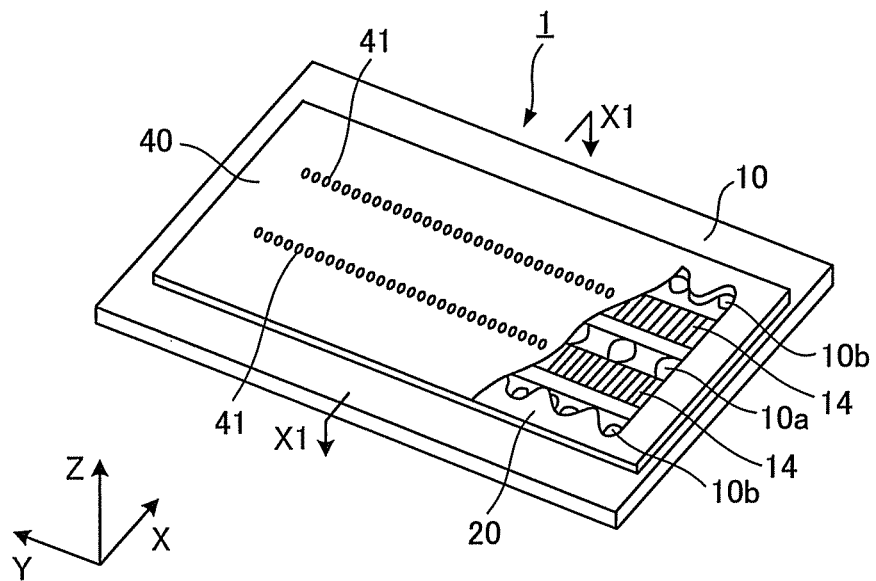
FIG. 11 is a diagram which shows the appearance of an inkjet head according to a second embodiment.
Figure 12:
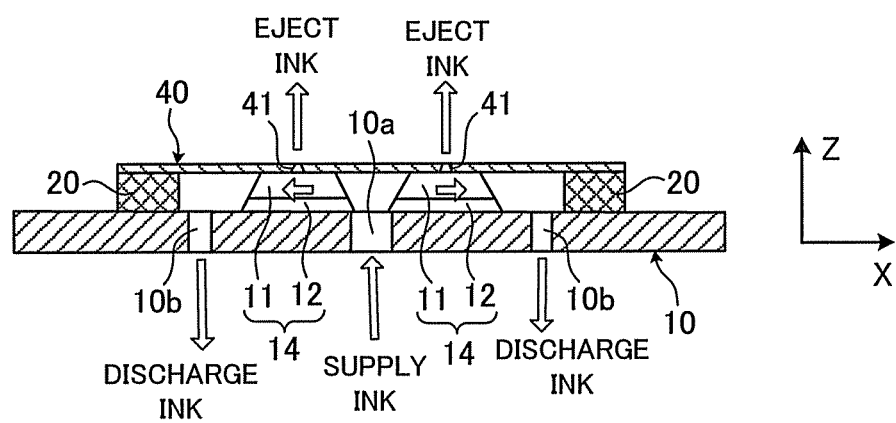
FIG. 12 is a cross-sectional view of the inkjet head according to the second embodiment.

Subsequently, a structure of the inkjet head according to the embodiment will be described. FIG. 11 is a diagram which shows the appearance of the inkjet head according to the embodiment. FIG. 12 is a cross-sectional diagram of FIG. 11 which is taken along line X1-X1. In FIGS. 11 and 12, the X, Y, and Z axes are orthogonal to each other.

A driving unit 14 is provided on the upper surface of a substrate 10. The driving unit 14 is formed by laminating two piezoelectric members 11 and 12. For example, the substrate 10 can be formed of Alumina or PZT. The piezoelectric members 11 and 12 can be formed of, for example, the PZT. Similarly to the first embodiment, the piezoelectric members 11 and 12 are polarized in the opposite direction to each other.

As shown in FIG. 11, a plurality of driving units 14 are aligned in the Y direction, and there are two rows of the plurality of driving units 14. A pressure chamber is present between the two driving units 14 which neighbor each other in the Y direction, and it is possible to change the capacity of the pressure chamber by deforming the two driving units 14. An operation of the driving unit 14 is the same as the operation described in FIGS. 3 and 4.

Electrodes are formed on the wall surface of the driving unit 14 which constitutes the pressure chamber. If a voltage is applied to the driving unit 14 through the electrodes, it is possible to deform the driving unit 14. If the capacity of the pressure chamber is increased due to the deformation of the driving unit 14, it is possible to take the ink into the pressure chamber. If the capacity of the pressure chamber is reduced due to the deformation of the driving unit 14, it is possible to eject the ink.

The substrate 10 has a supply port 10a and an outlet 10b. The supply port 10a is present between the two driving units 14 which neighbor each other in the X direction. The outlet 10b is present on the opposite side of the supply port 10a side with respect to the driving unit 14. A frame member 20 is arranged at the upper surface of the substrate 10, and the frame member 20 surrounds the plurality of driving units 14. A nozzle plate 40 is fixed to the upper surface of the driving units 14 and the frame member 20.

The nozzle plate 40 has a plurality of nozzles 41, and each nozzle 41 is provided corresponding to the pressure chamber. As shown in FIG. 11, the plurality of nozzles 41 is aligned in the Y direction, and two rows of the plurality of nozzles 41 are provided. According to the embodiment, two rows of the plurality of nozzles 41 are provided which align in the Y direction; however, one row of the plurality of nozzles 41 which align in the Y direction may be provided. The number of the nozzles 41 is appropriately set.

Subsequently, an operation of the inkjet head according to the embodiment will be described. An arrow shown in FIG. 12 denotes the movement direction of the ink.

The ink moves to the inside of the inkjet head 1 from the supply port 10a. The ink which passed through the supply port 10a proceeds to both sides in the X direction with respect to the supply port 10a. The ink from the supply port 10a moves to the pressure chamber. If the driving unit 14 deforms when ink is in the pressure chamber, the ink in the pressure chamber passes through the nozzles 41, and can be ejected to the outside of the inkjet head 1. The ink which has passed through the pressure chamber moves toward the outlet 10b of the substrate 10.

When the ink moves toward the outlet 10b from the supply port 10a, it is possible to discharge bubbles to the outside of the inkjet head 1 using the movement of the ink, even when the bubbles are generated inside the inkjet head 1. In addition, it is possible to suppress the change in temperature of the ink in the inkjet head 1, when the ink continuously moves toward the outlet 10b from the supply port 10a.

Subsequently, the manufacturing method of the inkjet head 1 will be described with reference to FIGS. 13 to 16.

Figure 13:
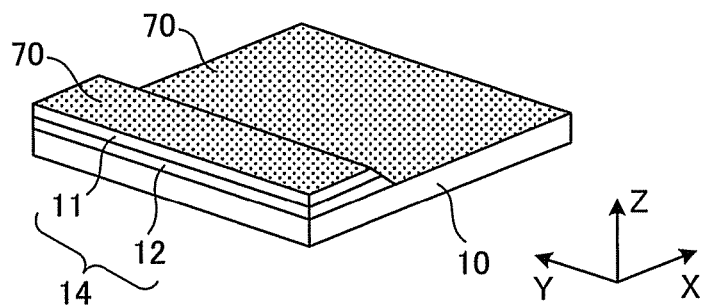
FIG. 13 is a diagram which shows a manufacturing process of the inkjet head according to the second embodiment.

As shown in FIG. 13, the driving unit 14 is formed on the front surface of the substrate 10. For example, it is possible to process the driving unit 14 to a shape shown in FIG. 13, after the two piezoelectric members 11 and 12 are laminated. Similarly to the first embodiment, the glass coating layer 70 is formed with respect to the front surface of the substrate 10 and the driving unit 14. The glass coating layer 70 is a compact layer compared to the piezoelectric member 11 and the substrate 10.

According to the embodiment, the glass coating layer 70 is formed on the entire front surface of the substrate 10 and the driving unit 14. Even in the embodiment, as a material for the glass coating layer 70, it is possible to use a material other than the glass coating agent, for example, an organic material such as polyimide (PI).

It is preferable to use a dry coating method when forming the glass coating layer 70. When forming the glass coating layer 70 using a wet coating method, a coating agent is easily filled in the base end portion of the driving unit 14.

Subsequently, as described in the first embodiment, an electrode 73 is formed using the electroless plating with respect to the front surface of the glass coating layer 70. In detail, a resist is applied onto the entire surface of the glass coating layer 70, and exposing and developing are performed so that the resist remains only in a region where the electrode 73 is not formed.

Figure 14:
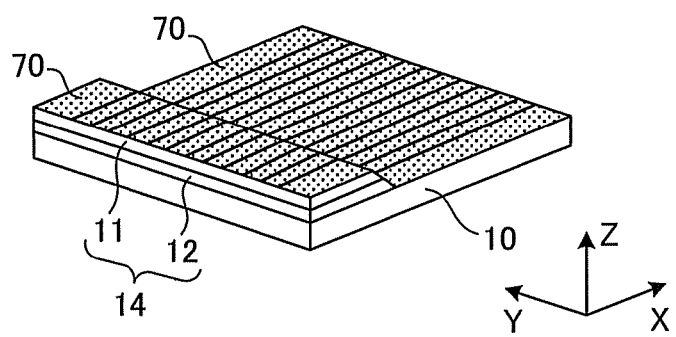
FIG. 14 is a diagram which shows the manufacturing process of the inkjet head according to the second embodiment.
Figure 15:
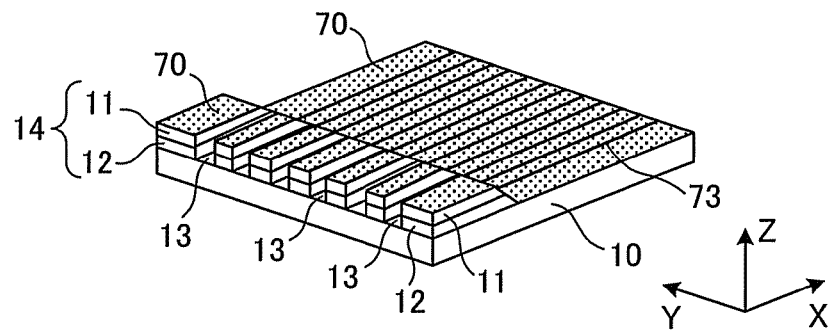
FIG. 15 is a diagram which shows the manufacturing process of the inkjet head according to the second embodiment.

Subsequently, a groove 13 (pressure chamber) is formed with respect to the driving unit 14 shown in FIG. 14. As shown in FIG. 15, it is possible to form the plurality of driving units 14 which is aligned in the Y direction, by forming a plurality of grooves 13. In addition, the electrodes 72 and 73 are formed using the electroless plating with respect to a region where the groove 13 and the resist are not formed.

Figure 16:
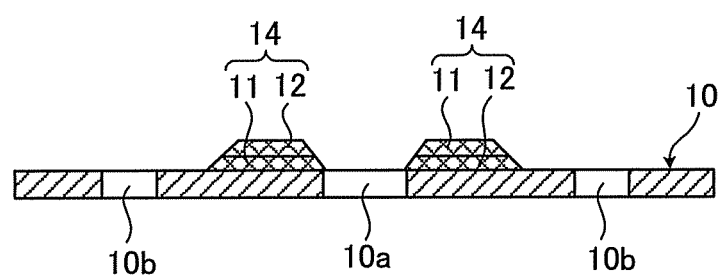
FIG. 16 is a diagram which shows the manufacturing process of the inkjet head according to the second embodiment.

As shown in FIG. 16, by preparing two structure bodies which are shown in FIG. 15, it is possible to constitute a part of the inkjet head 1. The outlet 10b is formed in the substrate 10.

Even in the embodiment, it is possible to prevent a preprocessing solution from permeating into the substrate 10 or between the particles of the driving unit 14, by forming the glass coating layer 70 on the front surface of the substrate 10 and the driving unit 14 before forming the electrode 73 using the electroless plating.

Third Embodiment

Figure 17:
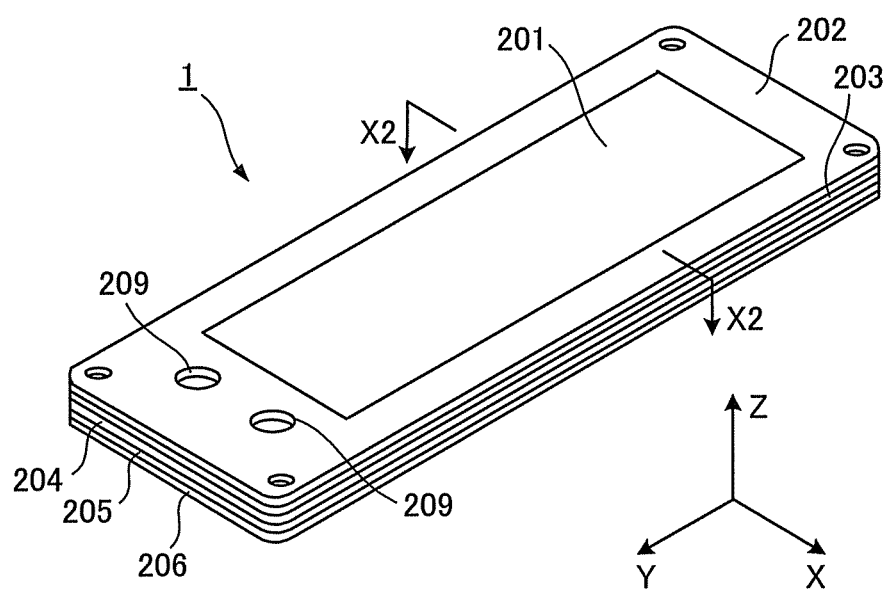
FIG. 17 is a diagram which shows the appearance of an inkjet head according to a third embodiment.
Figure 18:
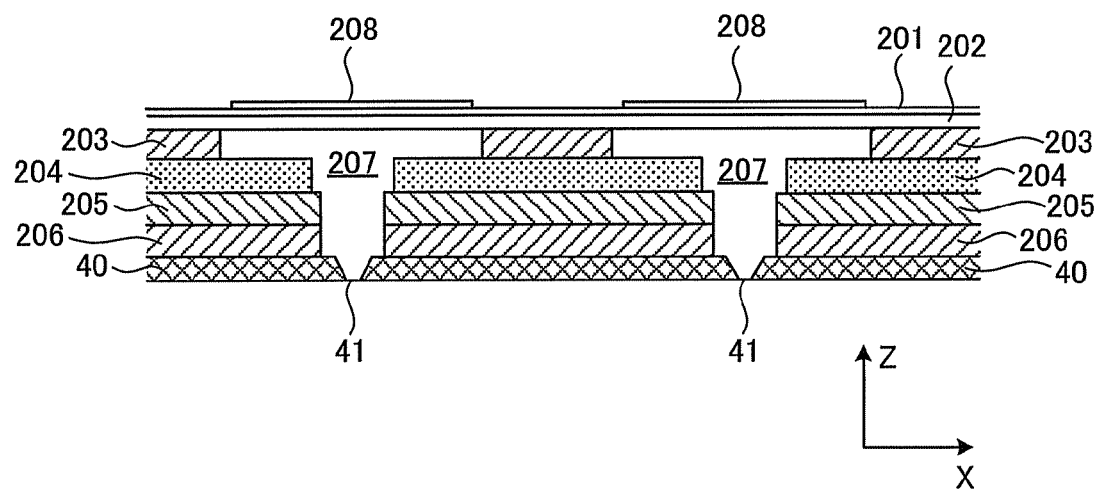
FIG. 18 is a cross-sectional view of the inkjet head according to the third embodiment.

An inkjet head according to a third embodiment will be described. FIG. 17 is a diagram which shows the appearance of the inkjet head according to the embodiment. FIG. 18 is a cross-sectional view of FIG. 17 taken along line X2-X2. In FIG. 17, the X, Y, and Z axes are orthogonal to each other. The relationship among the X, Y, and Z axes is similar in FIGS. 18 to 23.

The inkjet head 1 has a laminated structure, and in which a piezoelectric member 201, a vibration plate 202, a cavity plate 203, a spacer plate 204, manifold plates 205 and 206, and a nozzle plate 40 are overlapped from the uppermost layer toward the lower layer. The nozzle plate 40 has a plurality of nozzles 41. The vibration plate 202 has a supply port 209 which takes in the ink.

In the spacer plate 204 and the manifold plates 205 and 206, an opening portion which corresponds to the nozzle 41 is formed. A liquid chamber 207 is configured by these opening portions. The ink in the liquid chamber 207 is guided to the nozzle 41.

Figure 19:
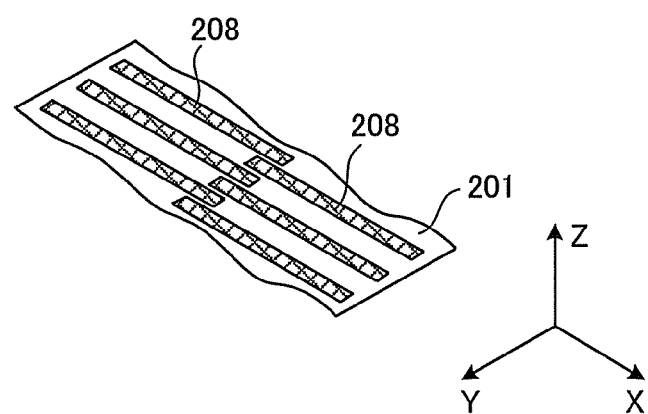
FIG. 19 is a diagram which shows a configuration of a driving unit of a piezoelectric member according to the third embodiment.

The piezoelectric member 201 is formed as a film on the vibration plate 202, and is subjected to polarization processing. In the embodiment, the polarization direction is orthogonal with respect to the surface of the vibration plate 202. An electrode 208 which corresponds to each of the liquid chambers 207 is formed on the upper surface (the surface opposite to the vibration plate 202) of the piezoelectric member 201. As shown in FIG. 19, the electrode 208 is extended in the X direction, the vibration plate 202 is formed of a conductive metal, and the piezoelectric member 201 is interposed between the vibration plate 202 and the electrode 208.

A wiring is connected to the plurality of electrodes 208, and a voltage from the driving unit is applied thereto. When the voltage is applied to the electrode 208, an electric field is formed in the same direction as the polarization direction. The electrode 208 is a positive electrode, and the vibration plate 202 is an earth electrode. The piezoelectric member 201 (corresponding to a driving unit) which is positioned immediately below the electrode 208, to which a voltage is applied, is driven, and contracts in a direction orthogonal to the polarization direction. Since the vibration plate 202 does not contract, the vibration plate 202 and the piezoelectric member 201 deform so as to be convex on the liquid chamber 207 side.

When the vibration plate 202 and the piezoelectric member 201 deform so as to be convex on the liquid chamber 207 side, the capacity in the liquid chamber 207 decreases, and the internal pressure of the liquid chamber 207 increases. When the internal pressure of the liquid chamber 207 increases, the ink in the liquid chamber 207 is ejected from the nozzle 41. When the application of the voltage to the electrode 208 is stopped, the piezoelectric member 201 and the vibration plate 202 return to a flat board shape from a curved shape, and the capacity of the liquid chamber 207 returns to its original capacity. Since the liquid chamber 207 is in a decompressed state, the ink is taken into the liquid chamber 207.

Subsequently, a method of forming the electrode 208 in the piezoelectric member 201 will be described with reference to FIGS. 20 to 23. FIGS. 20 to 23 are diagrams of the piezoelectric member 201 which are seen in the same direction.

Figure 20:
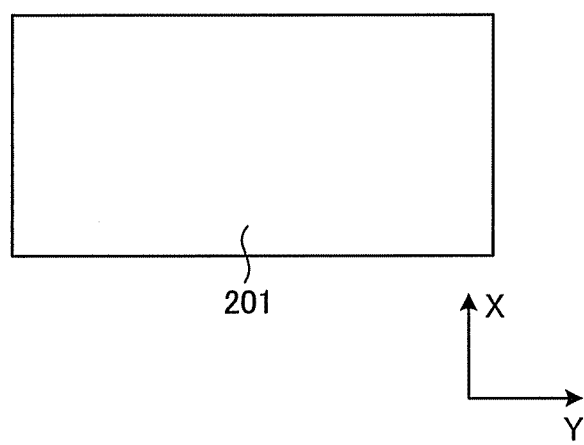
FIG. 20 is a diagram which shows a forming process of the driving unit of the piezoelectric member according to the third embodiment.
Figure 21:
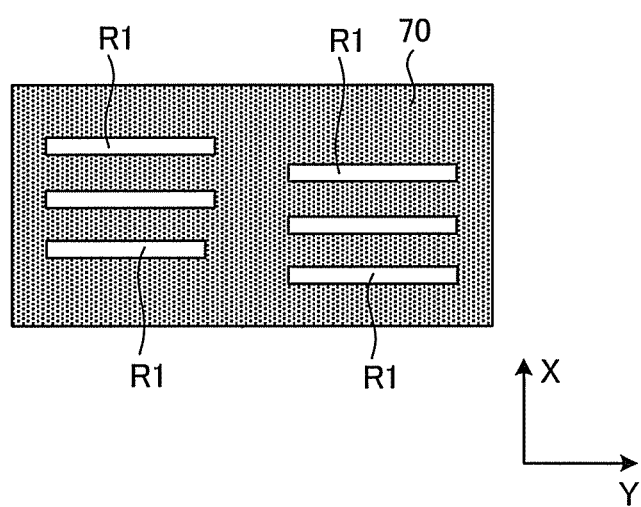
FIG. 21 is a diagram which shows a forming process of the driving unit of the piezoelectric member according to the third embodiment.

First, the piezoelectric member 201 of a flat board shape shown in FIG. 20 is prepared. The glass coating layer 70 is formed on the front surface of the piezoelectric member 201 as shown in FIG. 21. The glass coating layer 70 is a compact layer compared to the piezoelectric member 201.

As shown in FIG. 21, the glass coating layer 70 is not formed at a region R1 which is a part of the piezoelectric member 201 forming the electrode 208. The region R1 is a region which corresponds to a part of the electrode 208. For example, it is possible to apply a glass coating agent on the front surface of the piezoelectric member 201, in a state where the region R1 is masked. It is possible to form the glass coating layer 70 shown in FIG. 21, when a mask is peeled off after applying the glass coating agent.

Figure 22:
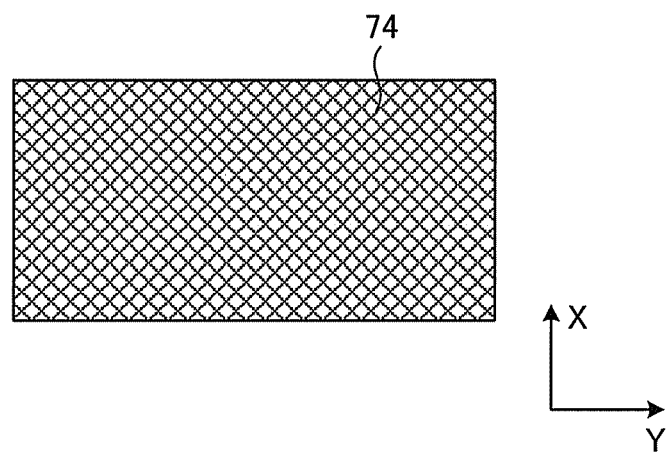
FIG. 22 is a diagram which shows a forming process of the driving unit of the piezoelectric member according to the third embodiment.
Figure 23:
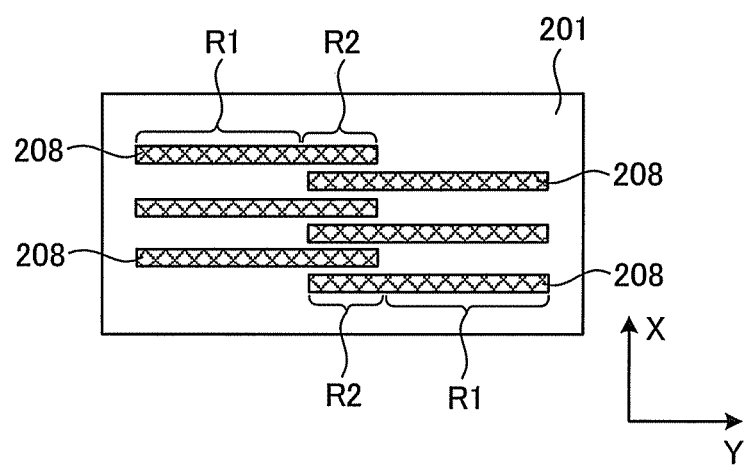
FIG. 23 is a diagram which shows a forming process of the driving unit of the piezoelectric member according to the third embodiment.

Subsequently, as shown in FIG. 22, a conductive layer 74 is formed using the electroless plating, with respect to a surface in which the glass coating layer 70 is formed. The conductive layer 74 is formed by nickel plating. The conductive layer 74 is formed with respect to the entire surface of the piezoelectric member 201. It is possible to form gold plating using the electro plating, after forming the nickel plating.

Subsequently, a region other than the region where the electrode 208 is formed is removed using etching, among the conductive layers 74. The regions where the electrode 208 is formed are regions R1 and R2. In the region R1, the conductive layer 74 comes into contact with the piezoelectric member 201. In the region R2, the glass coating layer 70 is present between the conductive layer 74 and the piezoelectric member 201.

According to the embodiment, the glass coating layer 70 is provided between the conductive layer 74 and the piezoelectric member 201, in the region R2. By providing the glass coating layer 70, it is possible to prevent a solution of the plating from permeating, even when the electroless plating is performed. Particularly, since the regions R2 are formed at a position close to each other, it is possible to prevent the solution of the plating from permeating, between two regions R2 which are close to each other, by forming the glass coating layer 70 with respect to the region R2.

In the above-described embodiment, the manufacturing method of the inkjet head 1 was described; however, the embodiment may be applied to a method other than the manufacturing method of the inkjet head 1. That is, it is possible to apply this embodiment when forming electrodes in a piezoelectric member using electroless plating.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An inkjet head manufacturing method comprising;
   forming an insulation layer which is denser than a piezoelectric member with respect to a region other than a groove;
   creating a driving unit, which ejects ink, by providing the groove in a portion of the piezoelectric member; and
   forming an electrode for applying a driving voltage to the driving unit, by performing electroless plating with respect to the driving unit and the insulating layer;
   wherein a region where the electrode is not formed and the insulation layer are covered with a resist layer, after forming the insulation layer,
   wherein the electroless plating is performed, after forming the resist layer, and
   wherein the resist layer is removed, after performing the electroless plating.

2. The method according to claim 1,
   wherein the insulation layer is formed with respect to a region among regions other than the driving unit and where at least the electrode is formed.

3. The method according to claim 2,
   wherein a conductive layer is formed using the electroless plating with respect to the driving unit and the insulation layer, and
   wherein the electrode is formed, by removing a region among the conductive layers which is not used as the electrode.

4. The method according to claim 2,
   wherein the driving unit is formed, by laminating the plurality of piezoelectric members of which the polarization direction is the opposite direction.

5. The method according to claim 2,
   wherein the insulation layer is formed using a glass coating agent.

6. The method according to claim 2,
   wherein the electrode is formed, by performing electro plating, after performing the electroless plating.

7. The method according to claim 1,
   wherein a conductive layer is formed using the electroless plating with respect to the driving unit and the insulation layer, and
   wherein the electrode is formed, by removing a region among the conductive layers which is not used as the electrode.

8. The method according to claim 7,
   wherein the driving unit is formed, by laminating the plurality of piezoelectric members of which the polarization direction is the opposite direction.

9. the method according to claim 7,
   wherein the insulation layer is formed using a glass coating agent.

10. The method according to claim 7,
    wherein the electrode is formed, by performing electro plating, after performing the electroless plating.

11. The method according to claim 1,
    wherein the driving unit is formed, by laminating the plurality of piezoelectric members of which a polarization direction is the opposite direction.

12. The method according to claim 11,
    wherein the insulation layer is formed using a glass coating agent.

13. The method according to claim 1,
    wherein the insulation layer is formed using a glass coating agent.

14. The method according to claim 1,
wherein the electrode is formed, by performing electro plating, after performing the electroless plating.

* * * * *